United States Patent [19]

Harder et al.

[11] Patent Number: 5,331,655
[45] Date of Patent: Jul. 19, 1994

[54] DECOUPLED OPTIC AND ELECTRONIC CONFINEMENT LASER DIODE

[75] Inventors: Christoph Harder, Zurich; Stefan Hausser, Thalwil; Heinz Meier, Thalwil, all of Switzerland

[73] Assignee: International Business Machines Corporation, Armonk, N.Y.

[21] Appl. No.: 45,772

[22] Filed: Apr. 14, 1993

[30] Foreign Application Priority Data

Jun. 22, 1992 [EP] European Pat. Off. ........ 92810473.6

[51] Int. Cl.$^5$ ............................................. H01S 3/19
[52] U.S. Cl. ........................................ 372/45; 372/46
[58] Field of Search ................................... 372/45, 46

[56] References Cited

U.S. PATENT DOCUMENTS

| | | | |
|---|---|---|---|
| 4,328,469 | 5/1982 | Scifres | 372/45 |
| 4,941,146 | 7/1990 | Kobayashi | 372/45 |
| 4,989,213 | 1/1991 | Haw et al. | 372/45 |
| 5,081,634 | 1/1992 | Weisbuch et al. | 372/45 |

OTHER PUBLICATIONS

"Room-Temperature Operation of an InGaAsP Double-Heterostructure Laser Emitting at 1.55 um on a Si Substrate" Applied Physics Letters 57(1990) Aug. 6, No. 6, pp. 593-595.

"The Growth of InGaAsP by CBE per SCH Quantum Well Lasers. Operating at 1.55 and 1.4 um", by M. E. Sherwin et al., Elsevier Science Publishers, Journal of Crystal Growth, 120, (1992), pp. 162-166.

*Primary Examiner*—Georgia Y. Epps
*Attorney, Agent, or Firm*—Richard Lau

[57] ABSTRACT

Laser diode with independent electronic and optical confinement, referred to as decoupled confinement, comprising an active region, i.e. an active layer, a single quantum well layer or a multi-quantum well layer, embedded in a carrier confinement structure providing for an energy barrier at least on one side of the active region. This energy barrier reduces carrier leakage out of the active region. The carrier confinement structure is embedded in an optical confinement structure which guides the optical light wave. The inventive laser diode is characterized in that the height of the energy barrier confining the carriers, and the refractive index step providing for optical waveguiding of the light wave are decoupled.

12 Claims, 6 Drawing Sheets

DECOUPLED OPTIC AND ELECTRONIC CONFINEMENT LASER DIODE

TECHNICAL FIELD

This invention relates generally to laser diodes with independent electronic carrier confinement and optic confinement.

BACKGROUND OF THE INVENTION

Laser diodes, in particular made of GaAs/AlGaAs, InGaAsP/InP and other ternary or quaternary alloys, have been intensely investigated in the last few years. The different designs of these lasers result in devices with highly efficient, extremely low thresholds and being capable of high power operation.

Especially for optical fiber communication, but also for other applications, the InGaAsP/InP material system received the most attention. This change of direction, from the well established AlGaAs/GaAs lasers to the InP based long wavelength lasers, emitting in the range of 1.3 µm-1.5 µm, was initiated by the great demand for lasers being suited for optical communication via silica fibers. The refractive index of this fiber material is wavelength dependant, giving the rise to a material dispersion which passes through zero at approximately 1.3 µm. This wavelength can be achieved by InGaAsP/InP laser diodes, as for example reported on in "Semiconductor Lasers for Long-Wavelength Optical-Fiber Communications Systems", M. J. Adams et al., published by P. Peregrinus Ltd., London, UK., 1987.

A typical InGaAsP laser diode with ridge waveguide structure is disclosed in "Performance of an Improved InGaAsP Ridge Waveguide Laser at 1.3 µm", I. P. Kaminow et al., Electronics Letters, Vol. 17, No. 9, April 1981, pp. 318-320. The structure of this separate confinement double heterostructure (SCH) ridge waveguide laser is illustrated in FIG. 1A, the thickness of the layers being exaggerated for the sake of clarity. The laser 10 consists of a separate confinement heterostructure (SCH) 12-14 which is grown on top of a n-doped InP substrate 11. The heterostructure comprises a lower n-doped InGaAsP cladding layer 12 ($E_g = 1.13$ eV), an undoped InGaAsP active layer 13 ($E_g = 0.95$ eV), and an upper p-doped InGaAsP cladding layer 14 ($E_g = 1.13$ eV). The ridge itself consists of an InP layer 15 ($E_g = 1.35$ eV) being p-doped and which is covered by a p-doped InGaAsP cap layer 16 and an Au/Zn alloyed contact layer 17. The whole structure, with the exception of the ridge, is covered by a $Si_3N_4$ insulation layer 18. A Ti/Ag, Au metallization 19 provides for an electric contact to the alloyed contact layer 17 on top of the ridge.

As can be seen from FIG. 1B, which shows the bandgap ($E_g$) vs. position (x) diagram of the respective structure 10, the active layer 13 with a bandgap of 0.95 eV is surrounded by higher bandgap cladding layers 12 and 14 with $E_g = 1.13$ eV. The energy barrier of 0.18 eV (30% of the total bandgap step between InP, 1.35 eV, and InGaAs, 0.75 eV) is not very high and does not provide for efficient electric carrier confinement. The real energy barrier in the valance band is about 60% of said 0.18 eV step and the barrier in the carrier band about 40% of 0.18 eV. The higher these energy barriers are, the better are the carriers confined inside the active layer 13. Optical confinement is provided by the refractive index step between the cladding layers 12 and 14 and the surrounding InP layers 11 and 15, as shown in the refractive index (n) vs. position (x) plot of FIG. 1C. The higher tile energy barriers are, i.e. a structure providing for efficient carrier confinement in the active layer, the worst is the optical confinement because said refractive index step decreases with increasing bandgap step and the maximum bandgap discontinuity remains constant only depending on the materials used.

Typical for this quaternary InGaAsP alloy is that the bandgap ($E_g$) can only be varied between 1.35 eV (InP) and 0.75 eV (InGaAs). Any improvement of the carrier confinement by providing for higher energy barriers has a detrimental effect on the optical confinement. None of the structures known in the art, some of them being listed below, provide for a solution of this conflict:

"Low Threshold InGaAsP Ridge Waveguide Lasers at 1.3 µm", I. P. Kaminow et al., IEEE Journal of Quantum Electronics, Vol. QE-19, No. 8, August 1983, pp. 1312-1318;

"Continuously Graded-Index Separate Confinement Heterostructure Multiquantum Well $Ga_{1-x}In_xAs_{1-y}P_y$/InP Ridge Waveguide Lasers Grown by Low-Pressure Metalorganic Chemical Vapor Deposition with Lattice-Matched Quaternary Wells and Barriers", M. J. Ludowise et al., Applied Physics Letters, Vol. 57, No. 15, October 1990, pp. 1493-1495;

"Strained Multiple Quantum Well Lasers Emitting at 1.3 µm Grown by Low-Pressure Metalorganic Vapor Phase Epitaxy", D. Coblentz et al., Applied Physics Letters, Vol. 59, No. 4, July 1991, pp. 405-407.

OBJECTS OF THE INVENTION

The main object of the present invention is to provide a laser structure which allows independent optic and electric confinement.

It is another object of the present invention to provide for a laser structure with improved carrier confinement, i.e. electric confinement.

SUMMARY OF THE INVENTION

This has been accomplished by embedding the active region, e.g. an active layer, a single quantum-well (SQW) or multiple quantum wells (MQW), in a carrier confinement structure which itself is situated within an optical confinement structure. The bandgap discontinuity of said carrier confinement structure is decoupled from the refractive index step providing for the optical confinement.

DESCRIPTION OF THE DRAWINGS

The invention is described in detail below with reference to the following drawings, which are schematic and not drawn to scale, while more particularly the dimensions of some parts are exaggerated for the sake of clarity.

DETAILED DESCRIPTION OF THE PREFERRED EMBODIMENTS

The quaternary alloy InGaAsP allows compositions with bandgaps between 1.35 eV (InP) and 0.75 eV (InGaAs) By modifying the As concentration in the $In_x Ga_{1-x} As_y P_{1-y}$ system, as indicated by the index y, the bandgap can be modified in the above energy range. The bandgap ($E_g$) as a function of the y, i.e. as function of the As concentration, is given by:

$$E_g = (1.35 - 0.72 \cdot y + 0.12 \cdot y^2) eV \quad (1)$$

Lattice match of $In_x Ga_{1-x} As_y P_{1-y}$ on InP is guaranteed on the condition that:

$$x = \frac{0.4526 \cdot y}{1 - 0.031 \cdot y} \quad (2)$$

An InGaAsP composition with y=0.2 has a bandgap of about 1.2 eV, calculated with equation (1). Inserting y=0.2 into equation (2) results in x=0.11 such that $In_{0.11}Ga_{0.89}As_{0.2}P_{0.8}$ is lattice matched to InP (y=0, x=1). Further details, beneath equations (1) and (2), of this quaternary alloy are for example given in "Calculated Absorption, Emission, and Gain in $In_{0.72}Ga_{0.28}As_{0.6}P_{0.4}$", N. K. Dutta, Journal of Applied Physics, Vol. 51, No. 12, December 1980, pp. 6095–6100. Providing for strained layers, the properties of a structure or its layers can be further modified. Properties of the above discussed InGaAsP, as well as other semiconductor compounds, are published in books such as "Numerical Data and Functional Relationships in Science and Technology", Landolt-Börnstein, New Series, Group III: Crystal and Solid State Physics. Volume 22, Springer-Verlag, and in particular its subvolume 22/a.

Figure 1A:
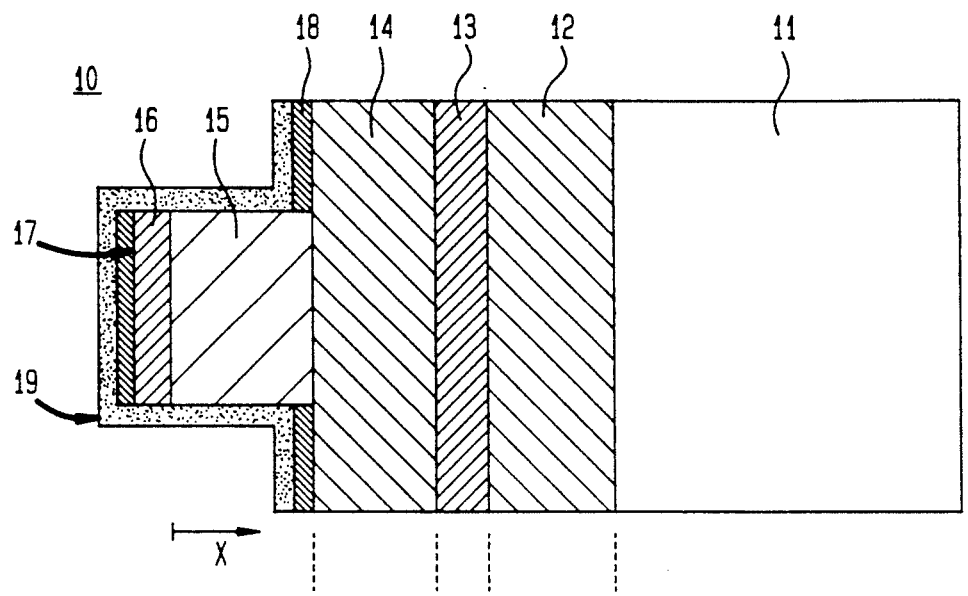
FIG. 1A shows a cross-section of a conventional InGaAsP/InP separate confinement heterostructure (SCH) ridge waveguide laser.
Figure 1B:
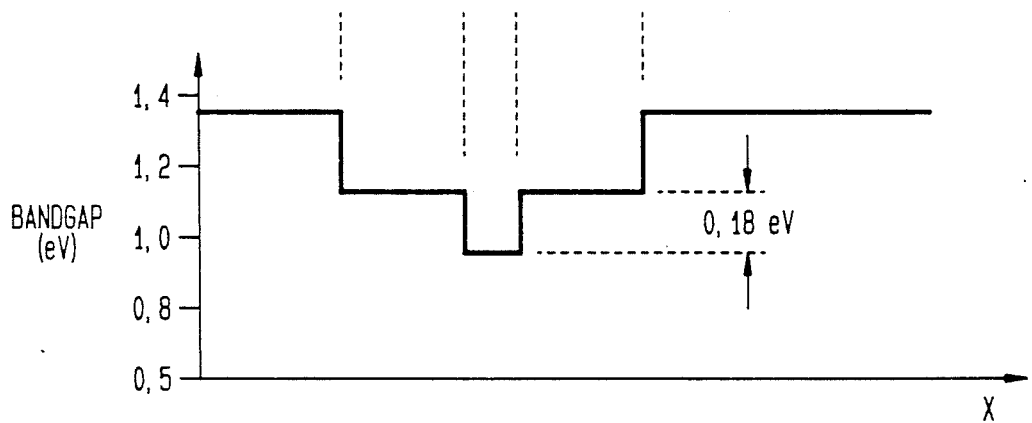
FIG. 1B shows a bandgap ($E_g$) vs. position (x) diagram of the SCH ridge waveguide laser of FIG. 1A.
Figure 1C:
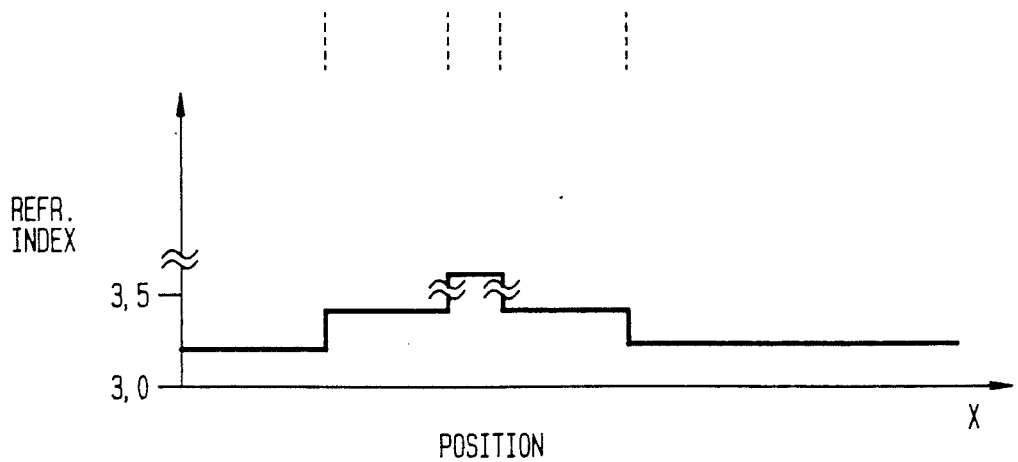
FIG. 1C shows a refractive index (n) vs. position (x) diagram of the SCH ridge waveguide laser of FIG. 1A.
Figure 2A:
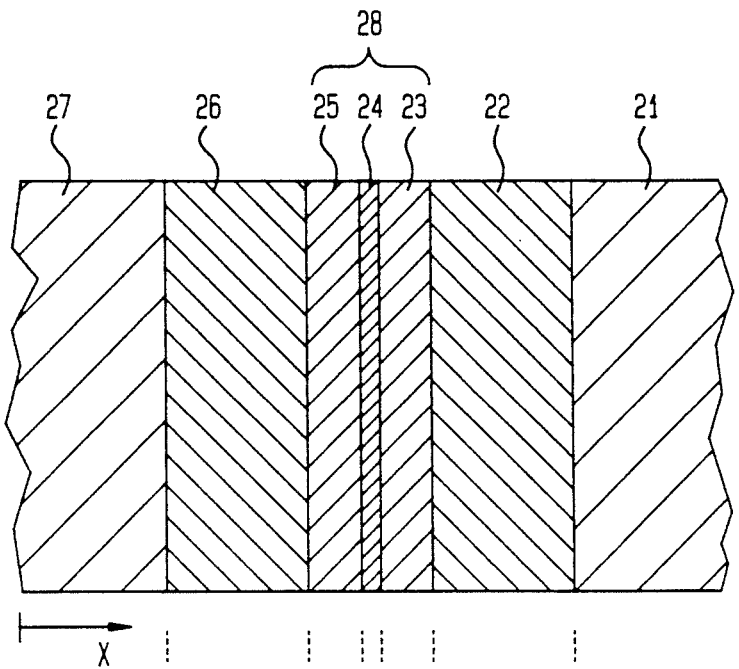
FIG. 2A shows a cross-sectional sketch of a laser diode in accordance with the first embodiment of the present invention.
Figure 2B:
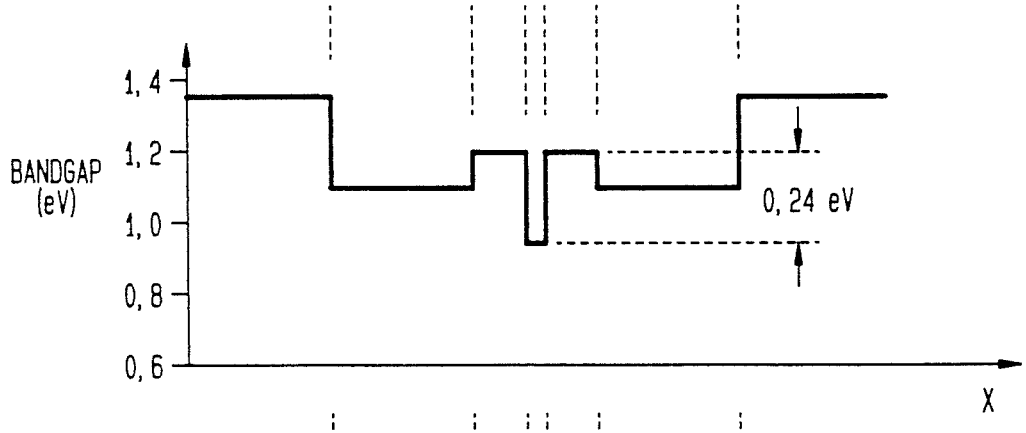
FIG. 2B shows a bandgap ($E_g$) vs. position (x) diagram of the inventive laser diode of FIG. 2A.
Figure 2C:
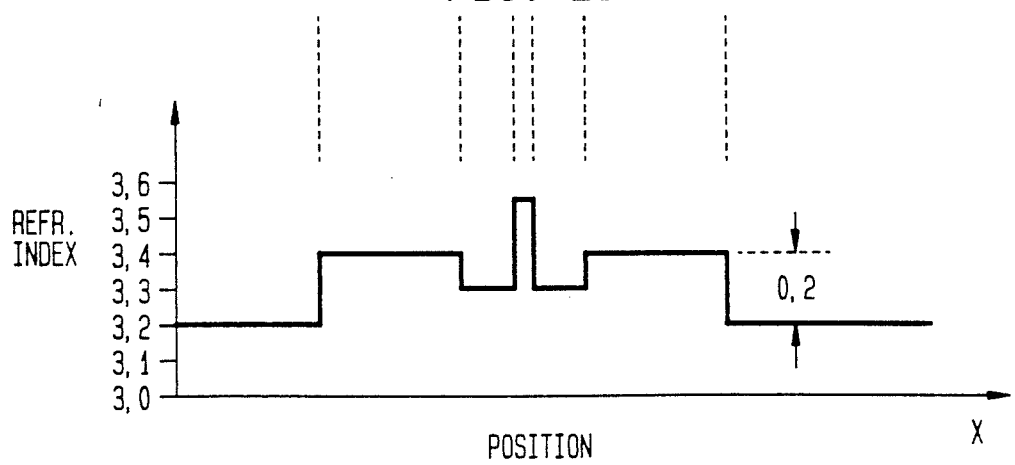
FIG. 2C shows a refractive index (n) vs. position (x) diagram of the inventive laser diode of FIG. 2A.

The first embodiment of the invention is illustrated in FIGS. 2A-2C. FIG. 2A shows a cross-sectional sketch, not drawn to scale, of an inventive laser diode. The InGaAsP active layer 24 of this laser is embedded between an upper and a lower InGaAsP carrier confinement layer 25 and 23, respectively. The composition of these carrier confinement layers, see Table 1, is chosen such that it provides for high energy barriers on either side of the active layer 24. Layers 25 and 23 may even consist of InP. By partly doping these carrier confinement layers 25 and 23 the bandgap structure can be further modified. The structure comprising the active layer 24, and the two carrier confinement layers 23 and 25 is hereinafter referred to as carrier confinement structure 28. This carrier confinement structure 28 is sandwiched between two InGaAsP optical confinement layers 22 and 26, the lower optical confinement layer 22 being either slightly n-doped or undoped and the upper layer 26 being slightly p-doped or undoped, too. The carrier confinement structure 28, embedded between said optical confinement layers 22 and 26, is situated between a lower, n-doped, InP cladding layer 21 and an upper, p-doped, InP cladding layer 27. The whole structure is grown on top of an InP substrate (not shown).

The bandgap ($E_g$) vs. position (x) diagram of this structure is illustrated in FIG. 2B. The bandgap of the active layer 24 is about 0.96 eV, instead of 0.88 eV, since this layer is strained. As can be seen from this diagram, the bandgap discontinuity between the active layer 24 and the surrounding carrier confinement layers 23, 25 is 0.24 eV (about 40% of the total bandgap step between InP and InGaAs). The carriers, electrons as well as holes, are confined in the active region by the heterojunction potential barriers built up by said carrier confinement layers 23 and 25 on both sides. The optical field is confined within the structure by the abrupt reduction of tile refractive index, i.e. a step in the refractive index of about 0.2, between the optical confinement layers 22, 26 and the cladding layers 21 and 27, as illustrated in FIG. 2C. The composition of the respective layers can be determined by using either equations (1) and (2), or by taking the already mentioned books "Numerical Data and Functional Relationships in Science and Technology", Landolt-Börnstein. More details of this embodiment are given in Table 1.

TABLE 1

| Layer | No. | Material | Doping (cm$^{-3}$) | Width (nm) | Bandgap (eV) | Ref. Index |
|---|---|---|---|---|---|---|
| substrate | — | InP | | | 1.35 | |
| cladding | 21 | InP | $1 \times 10^{18}$ (n) | 500 | 1.35 | 3.21 |
| optical conf. | 22 | InGaAsP | $\leq 7 \times 10^{17}$ (n) | 100 | 1.1 | 3.41 |
| carrier conf. | 23 | InGaAsP | $\sim 1 \times 10^{18}$ (n) | 15 | 1.2 | 3.29 |
| active (strained) | 24 | InGaAsP | 0 | 5 | 0.96 | 3.55 |
| carrier conf. | 25 | InGaAsP | $\sim 1 \times 10^{18}$ (p) | 15 | 1.2 | 3.29 |
| optical conf. | 26 | InGaAsP | $\leq 7 \times 10^{17}$ (p) | 100 | 1.1 | 3.41 |

TABLE 1-continued

| | | Exemplary details of the first embodiment | | | |
|---|---|---|---|---|---|
| Layer | No. | Material | Doping (cm$^{-3}$) | Width (nm) | Bandgap (eV) | Ref. Index |
| cladding | 27 | InP | 1 × 10$^{18}$ (p) | 1500 | 1.35 | 3.21 |

This first embodiment of the present invention can be modified by replacing the active layer (24) against a single quantum well or a multi-quantum well structure. The materials of the respective active layer(s), i.e active layer, SQW layer, or MQW layer, and the surrounding carrier confinement layers have to be chosen such that the energy barrier, with forward voltage applied, is high enough to efficiently confine the carriers in the respective active region. The carrier confinement, as well as the optical confinement structure have not necessarily to be symmetrical. To reduce electron leakage out of the active region, for example, a structure is suited having an energy barrier only on one side of the active region, i.e. between active layer and the p-doped optical confinement layer.

Figure 3A:
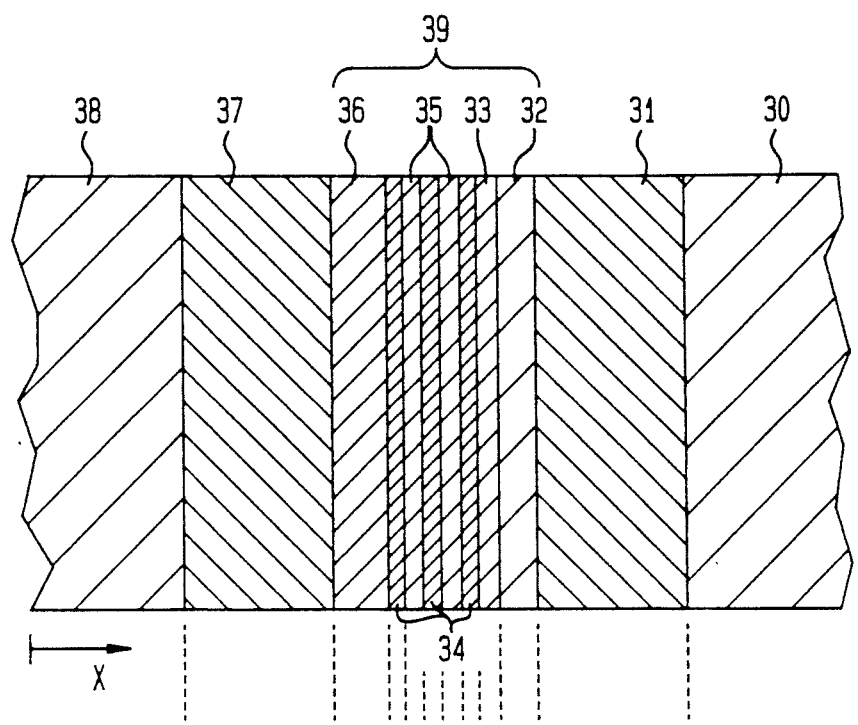
FIG. 3A shows a cross-sectional sketch of a multi-quantum well (MQW) laser diode in accordance with the second embodiment of the present invention.
Figure 3B:
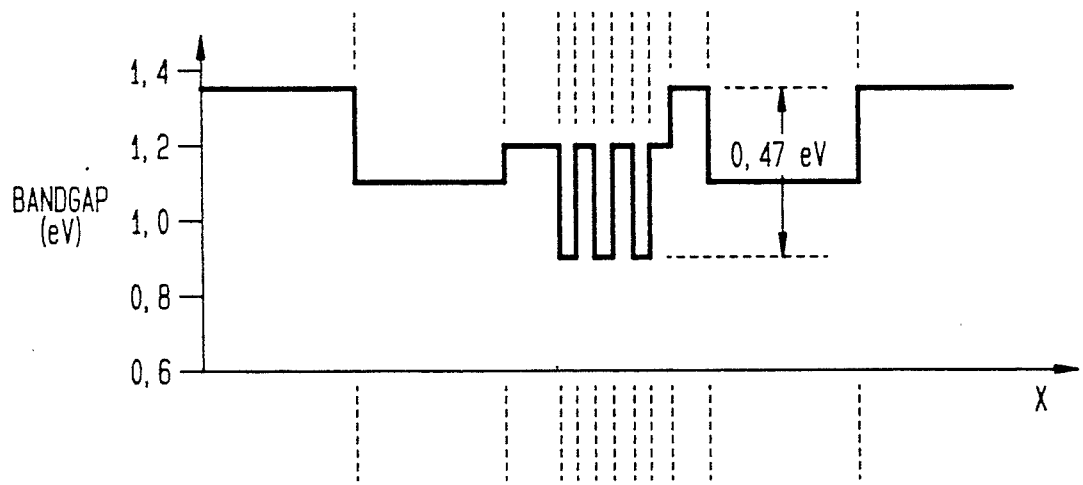
FIG. 3B shows a bandgap ($E_g$) vs. position (x) diagram of the inventive laser diode of FIG. 3A.
Figure 3C:
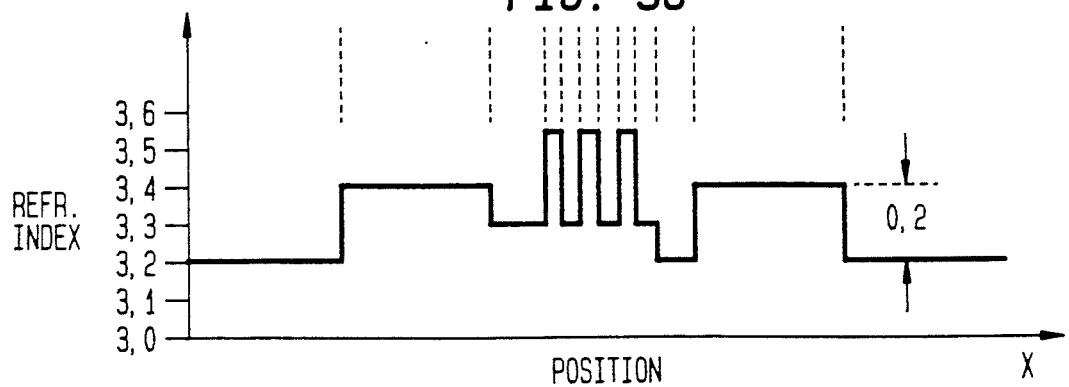
FIG. 3C shows a refractive index (n) vs. position (x) diagram of the inventive laser diode of FIG. 3A.

A second embodiment of the present invention is described in context with FIGS. 3A–3C. The carrier confinement structure 39 of this embodiment comprises three InGaAsP quantum wells 34, being separated by InGaAsP barrier layers 35, and carrier confinement layers 32, 33 and 36. To achieve carrier confinement, the quantum well structure, consisting of said quantum wells 34 and barriers 35, is embedded between lower carrier confinement layers 32, 33 and an upper carrier confinement layer 36. The lower carrier confinement layers, layer 32 consisting of InGaAsP with a bandgap of 1.2 eV, layer 33 consisting of InP with bandgap 1.35 eV, provide for an overall bandgap step of about 0.47 eV, which is about 78% of the total bandgap discontinuity between InP (1.35 eV) and InGaAs (0.75 eV). The upper carrier confinement layer 36 is made of InGaAsP, with bandgap 1.2 eV. This unsymmetrical carrier confinement structure 39 is specially designed to reduce carrier leakage out of the quantum well structure. In this example the InP layer 32 serves as barrier for holes.

Similar to the first embodiment, the carrier confinement structure 39 is sandwiched between InGaAsP optical confinement layers 31 and 37 (1.2 eV), and InP (1.35 eV) cladding layers 30, 38. The corresponding bandgap ($E_g$) vs. position (x) and the refractive index (n) vs. position (x) diagrams are shown in FIGS. 2B and 2C, respectively. More details of the second embodiment are listed in Table 2.

TABLE 2

| | | Exemplary details of the second embodiment | | | |
|---|---|---|---|---|---|
| Layer | No. | Material | Doping (cm$^{-3}$) | Width (nm) | Bandgap (eV) | Ref. Index |
| substrate | — | InP | | | 1.35 | |
| cladding | 30 | InP | 1 × 10$^{18}$ (n) | 500 | 1.35 | 3.21 |
| optical conf. | 31 | InGaAsP | <7 × 10$^{17}$ (n) | 100 | 1.1 | 3.41 |
| carrier conf. | 32 | InP | 4 × 10$^{18}$ (n) | 22 | 1.35 | 3.21 |
| carrier conf. | 33 | InGaAsP | 0 | 15 | 1.2 | 3.29 |
| quantum well | 34 | InGaAsP | 0 | 5 | 0.88 | 3.55 |
| barrier | 35 | InGaAsP | 0 | 5 | 1.2 | 3.29 |
| quantum well | 34 | InGaAsP | 0 | 5 | 0.88 | 3.55 |
| barrier | 35 | InGaAsP | 0 | 5 | 1.2 | 3.29 |
| quantum well | 34 | InGaAsP | 0 | 5 | 0.88 | 3.55 |
| carrier conf. | 36 | InGaAsP | 5 × 10$^{17}$ (p) | 15 | 1.2 | 3.29 |
| optical conf. | 37 | InGaAsP | 2 × 10$^{17}$ (p) | 100 | 1.1 | 3.41 |
| cladding | 38 | InP | 1 × 10$^{18}$ (p) | 1500 | 1.35 | 3.21 |

The second embodiment, a laser diode with multi-quantum well structure and an InP hole barrier, can be modified as indicated in the following:

replacing the MQW structure either by a SQW structure or a single active layer;

providing for an energy barrier on both sides of the active region either by choosing materials with high bandgap and/or doping the respective layers of the carrier confinement structure accordingly;

replacing some of the strained layers by unstrained layers;

usage of other compound semiconductors than InGaAsP;

reversing the doping such that the laser is grown on top of an p-doped substrate instead of a n-doped one;

modifying the width of one or more layers.

Figure 4A:
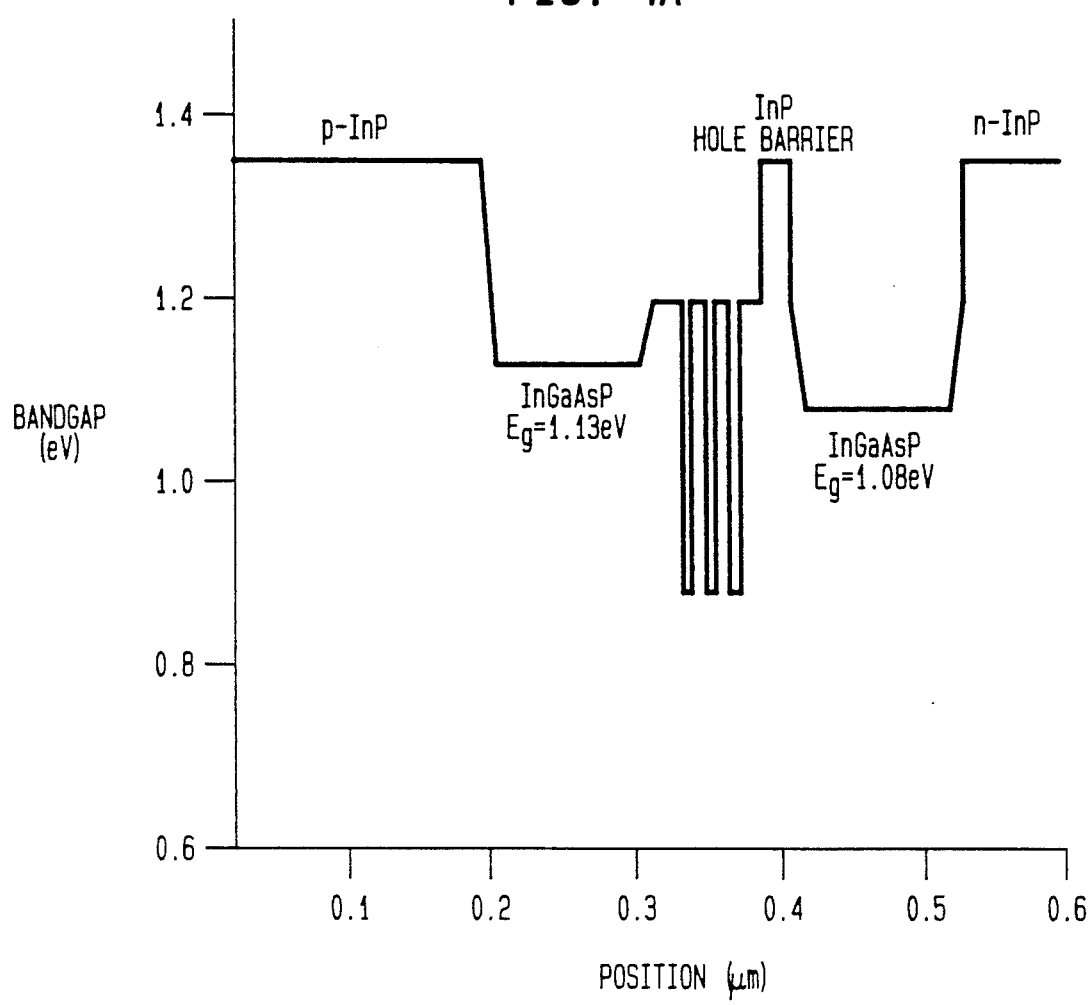
FIG. 4A shows a bandgap ($E_g$) vs. position (x) diagram of multi-quantum well (MQW) laser diode in accordance with the third embodiment of the present invention.
Figure 4B:
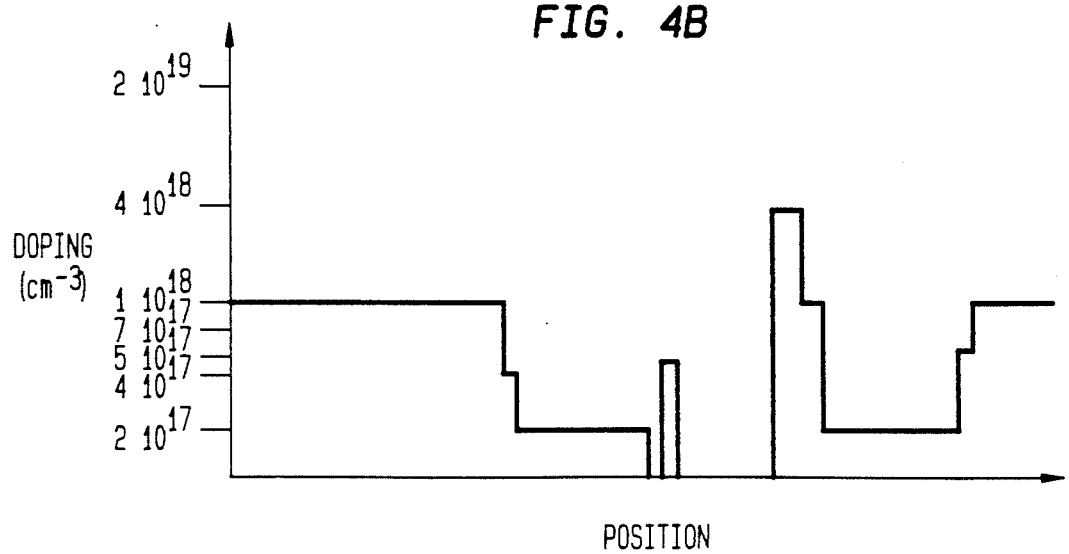
FIG. 4B shows the doping vs. position (x) diagram of the inventive laser diode of FIG. 4A.

The bandgap ($E_g$) vs. position (x) diagram of the third embodiment is illustrated in FIG. 4A. This bandgap structure is characterized by two main features distinguishing it from the bandgap diagram shown in FIG. 3B. Firstly, all bandgap discontinuities are continuously graded providing for better electrical properties. Secondly, the carrier confinement structure, in particular the InP hole barrier thereof, is highly doped to reduce carrier leakage out of the active region, as illustrated in FIG. 4B. The shown doping profile is an example which gives details of the doping. The concentration of the dopants is stepwise reduced, starting at about 1×10$^{18}$ cm$^{-3}$ ionized dopants at room temperature (RT), from the InP cladding layers to the InGaAsP optical confinement layers. The active region, comprising InGaAsP quantum wells and InGaAsP barrier layers, remains undoped. In this embodiment, the InP hole barrier of the carrier confinement structure is doped with 4×10$^{18}$ cm$^{-3}$ ionized dopants at RT. More details of this particular embodiment, including details of a complete laser diode comprising said active region (MQW) embedded between carrier confinement layers and optical confinement layers, as shown in FIGS. 4A and 4B, are listed in Table 3.

TABLE 3

Exemplary details of the third embodiment

| Layer | No. | Material | Doping (cm$^{-3}$) | Width (nm) | Bandgap | Ref. Index |
|---|---|---|---|---|---|---|
| substrate | — | InP | | | 1.35 | |
| cladding | — | InP | $1 \times 10^{18}$ (n) | 500 | 1.35 | 3.21 |
| optical confinement | — | InGaAsP-InP | $2 \times 10^{17}$ (n) | 10 | 1.1–1.35 | 3.41–3.21 |
| optical conf. | — | InGaAsP | $2 \times 10^{17}$ (n) | 100 | 1.1 | 3.41 |
| carrier confinement | — | InP-InGaAsP | $1 \times 10^{18}$ (n) | 10 | 1.35–1.1 | 3.21–3.41 |
| carrier conf. | — | InP | $4 \times 10^{18}$ (n) | 22 | 1.35 | 3.21 |
| carrier conf. | — | InGaAsP | 0 | 15 | 1.2 | 3.29 |
| quantum well | — | InGaAsP | 0 | 6 | 0.88 | 3.55 |
| barrier | — | InGaAsP | 0 | 10 | 1.2 | 3.29 |
| quantum well | — | InGaAsP | 0 | 6 | 0.88 | 3.55 |
| barrier | — | InGaAsP | 0 | 10 | 1.2 | 3.29 |
| quantum well | — | InGaAsP | 0 | 6 | 0.88 | 3.55 |
| carrier conf. | — | InGaAsP | 0 | 15 | 1.2 | 3.29 |
| carrier conf. | — | InGaAsP | $5 \times 10^{17}$ (p) | 5 | 1.2 | 3.29 |
| carrier confinement | — | InGaAsP-InGaAsP | 0 | 10 | 1.1–1.2 | 3.41–3.29 |
| optical conf. | — | InGaAsP | $2 \times 10^{17}$ (p) | 100 | 1.1 | 3.41 |
| optical confinement | — | InP-InGaAsP | $4 \times 10^{17}$ (p) | 10 | 1.35–1.1 | 3.21–3.41 |
| cladding | — | InP | $1 \times 10^{18}$ (p) | 1500 | 1.35 | 3.21 |
| contact | — | InGaAs | $2 \times 10^{19}$ (p) | 100 | 0.75 | 3.65 |
| contact | — | Ti | | 15 | | 3.62 |
| contact | — | Pt | | 150 | | 4.25 |
| contact | — | Au | | 200 | | 0.13 |

Figure 5:
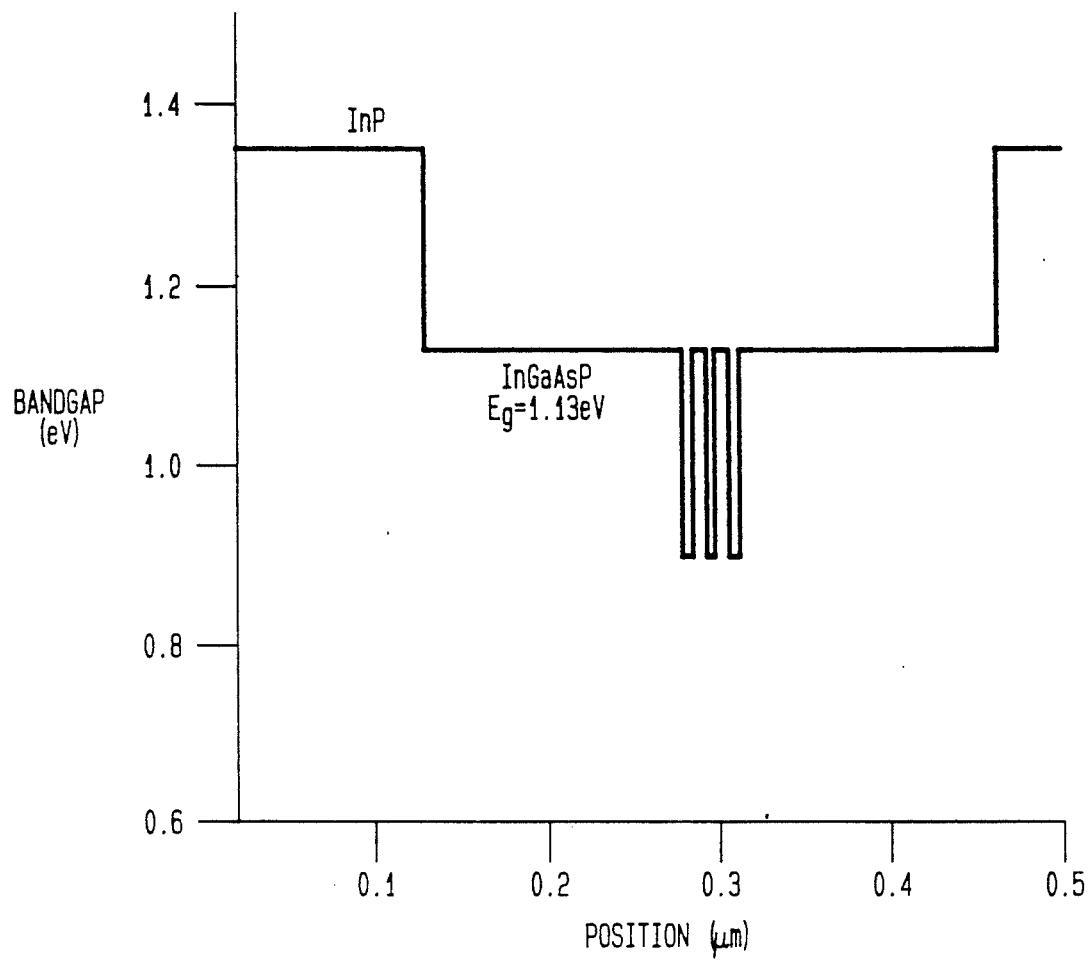
FIG. 5 shows a bandgap ($E_g$) vs. position (x) diagram of a conventional InGaAsP multi-quantum well (MQW) laser diode.
Figure 6:
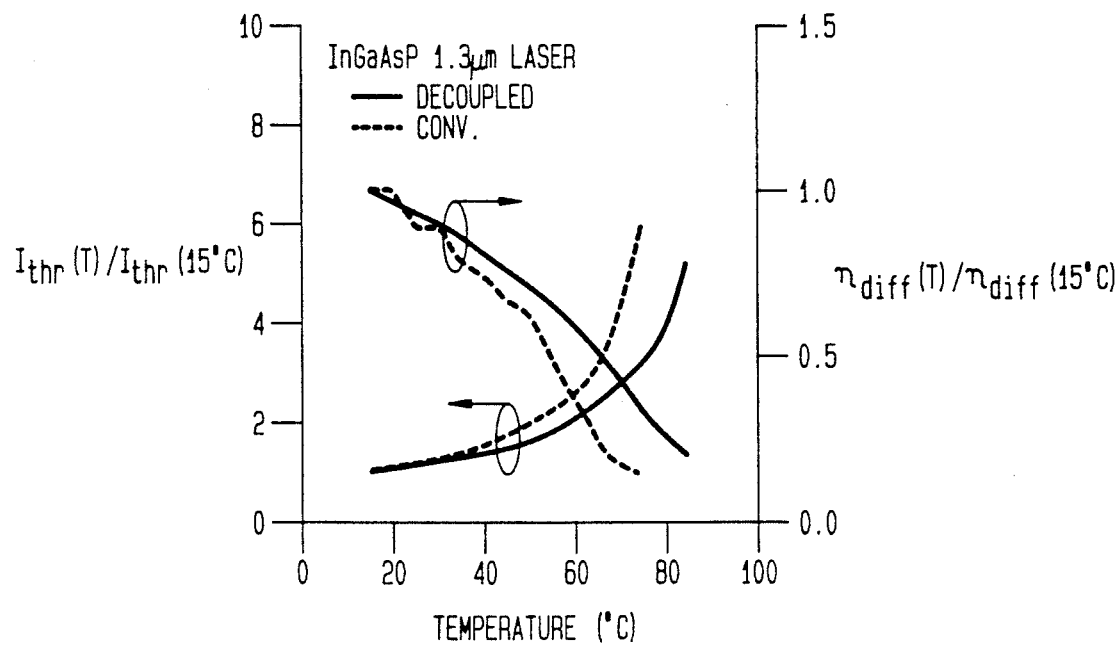
FIG. 6 shows a threshold current ($I_{thr}$) and quantum efficiency ($\eta_{diff}$) vs. temperature (T) diagram of the MQW laser diode in accordance with the third embodiment of the present invention and a MQW laser diode as illustrated in FIG. 5.
Figure 7:
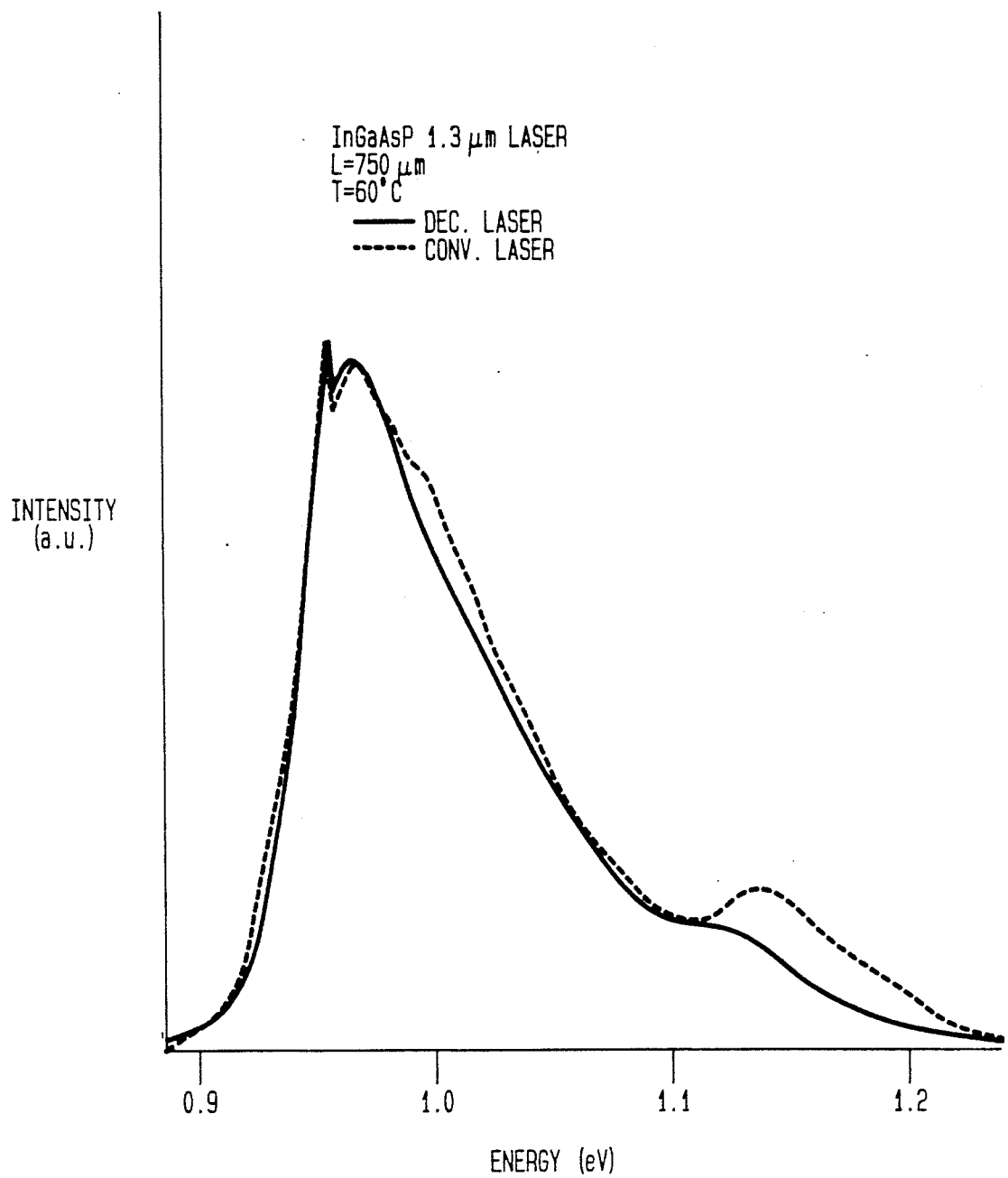
FIG. 7 shows an intensity vs. energy diagram of the spontaneous emission of the MQW laser diode in accordance with the third embodiment of the present invention and a MQW laser diode as illustrated in FIG. 5.

The advantages of the herein disclosed laser structures with decoupled optic and electric confinement becomes obvious when comparing the performance of the third embodiment with a conventional InGaAsP multi-quantum well (MQW) laser diode, as illustrated in FIG. 5. This conventional laser diode has no carrier confinement structure comparable with the one of the present invention, the bandgap step between the quantum wells (0.88 eV) and the InGaAsP (1.13 eV) optical confinement layers providing for the carrier confinement. The widths of the layers of this conventional MQW laser diode are similar to the widths of the respective layers of the third embodiment. The threshold ($I_{thr}$) vs. temperature (T), and the differential quantum efficiency ($\eta_{diff}$) vs. temperature (T), diagrams of both lasers are plotted in FIG. 6. As can be seen from this diagram, the inventive laser diode has been substantially improved in comparison to the conventional diode. Another diagram, which shows the intensity of the spontaneous emission of the inventive laser with decoupled confinement on one hand and the conventional laser on the other hand as function of the energy, is given in FIG. 7. The intensity curve of the conventional laser diode (dashed line) has a local maximum at about 1.15 eV. This intensity increase is mainly caused by carrier leakage out of the active region, i.e. the quantum wells. The carrier leakage has been efficiently suppressed by the inventive structure as shown by the solid line.

We claim:

1. In a separate confinement heterostructure semiconductor laser diode with an active region, comprising:
   at least one InGaAsP active layer with a bandgap of $E_{gA}$;
   a carrier confinement structure comprising at least one InGaAsP carrier confinement layer with a bandgap of $E_{gD}$, said carrier confinement structure having said at least one InGaAsP active layer embedded therein; and
   an upper InGaAsP optical confinement layer with a bandgap of $E_{gB}$, wherein $E_{gD}$ is greater than $E_{gB}$, and a lower InGaAsP optical confinement layer with a bandgap of $E_{gC}$, said optical confinement layers having said carrier confinement structure sandwiched therebetween, wherein there is provided a first bandgap step $\Delta E_1$ between said at least one InGaAsP active layer and said lower InGaAsP optical confinement layer, with $\Delta E_1$ being greater than $E_{gC}$-$E_{gA}$, and a second bandgap step $\Delta E_2$ between said at least one InGaAsP active layer and said upper InGaAsP optical confinement layer, with $\Delta E_2$ being greater than $E_{gB}$-$E_{gA}$.

2. The laser diode of claim 1, wherein said carrier confinement structure comprises a further InGaAsP carrier confinement layer with bandgap $E_{gE}$, such that $E_{gE} > E_{gC}$.

3. The laser diode of claim 1 or 2, wherein at least one of said carrier confinement layers is highly doped, $>1 \times 10^{18}$ cm$^{-3}$ ionized dopants at room temperature, reducing the carrier leakage out of said active region.

4. The laser diode of claim 1, wherein
   said at least one InGaAsP active layer consists of InGaAs$_{y_A}$P, with $y_A \geq 0.6$, having a bandgap $E_{gA} \leq 0.96$ eV; and
   said carrier confinement structure comprises an upper InGaAs$_{y_D}$P carrier confinement layer, with $y_D \leq 0.5$ and $E_{gD} \geq 1$ eV and a lower InGaAs$_{y_E}$P carrier confinement layer, with $y_E \leq 0.5$ and $E_{gE} \geq 1$ eV.

5. The laser diode of claim 4, wherein said carrier confinement structure is situated between
   an upper InGaAs$_{0.4}$P optical confinement layer with bandgap $E_{gB} \cong 1.1$ eV, and
   a lower InGaAs$_{0.4}$P optical confinement layer with bandgap $E_{gC} \cong 1.1$ eV.

6. The laser diode of claim 4 or 5, wherein said optical confinement layers are embedded between an upper InP cladding layer and a lower InP cladding layer, the whole structure being grown on top of an InP substrate.

7. The laser diode of claim 1, wherein said at least one InGaAsP active layer is an InGaAs$_{y_A}$P quantum well, with $y_A \geq 0.6$ and a bandgap $E_{gA} \leq 0.96$ eV, said carrier confinement structure comprising:
   an upper InGaAs$_{y_D}$P carrier confinement layer, with $Y_D \leq 0.3$ and a bandgap $E_{gD} \geq 1.14$ eV, and
   a lower InGaAs$_{y_E}$P carrier confinement layer, with $y_E \leq 0.3$ and a bandgap $E_{gE} \geq 1.14$ eV.

8. The laser diode of claim 7, wherein said carrier confinement structure comprises an additional InP carrier confinement layer having a bandgap $E_{gF} \cong 1.35$ eV, which is situated on one side of said at least one InGaAsP active region.

9. The laser diode of claim 7, wherein at least a portion of at least one of said carrier confinement layers is highly doped, $>1\times 10^{18}$ cm$^{-3}$ ionized dopants at room temperature.

10. The laser diode of claim 8, wherein at least a portion of at least one of said carrier confinement layers is highly doped, $>1\times 10^{18}$cm$^{-3}$ ionized dopants at room temperature.

11. The laser diode of claim 7, 8, 9 or 10 wherein said carrier confinement structure is sandwiched between
an upper InGaAs$_{y_B}$P optical confinement layer with $0.3<y_B<0.6$, and
a lower InGaAs$_{y_C}$P optical confinement layer with $0.3<y_C<0.6$.

12. The laser diode of claim 11, wherein
the quantum well is undoped, 6 nm wide and consists of InGaAs$_{0.7}$P;
said upper carrier confinement layer is undoped, 15 nm wide and consists of InGaAs$_{0.2}$P;
said lower carrier confinement layer is undoped, 15 nm wide and consists of InGaAs$_{0.2}$P;
said upper optical confinement layer is p-doped with $>1\times 10^{17}$cm$^{-3}$ dopants, at least 100 nm wide, and consists of InGaAs$_{0.4}$P, and said lower optical confinement layer is n-doped with $>1\times 10^{17}$cm$^{-3}$ dopants, at least 100 nm wide, and consists of InGaAs$_{0.4}$P;
this whole structure being situated between an upper p-doped InP cladding layer and a lower n-doped InP cladding layer.

* * * * *